US005806423A

United States Patent [19]
Tani

[11] Patent Number: 5,806,423
[45] Date of Patent: Sep. 15, 1998

[54] PRINTING SQUEEGEE APPARATUS

[75] Inventor: Okie Tani, Tokyo, Japan

[73] Assignee: Tani Electronics Industry Co., Ltd., Tokyo, Japan

[21] Appl. No.: 826,101

[22] Filed: Mar. 24, 1997

[30] Foreign Application Priority Data

May 14, 1996 [JP] Japan .................................. 8-118615

[51] Int. Cl.⁶ .................................................. B05C 17/04
[52] U.S. Cl. ........................ 101/123; 101/124; 101/119; 101/120
[58] Field of Search ................................... 101/115, 116, 101/119, 120, 123, 124, 129, DIG. 34; 118/429, 422, 406, 213

[56] References Cited

U.S. PATENT DOCUMENTS

| | | | |
|---|---|---|---|
| 3,805,699 | 4/1974 | Mallofre | 101/123 |
| 3,885,493 | 5/1975 | Jaffa | 101/123 |
| 3,969,999 | 7/1976 | Zimmer | 101/120 |
| 4,957,045 | 9/1990 | Messerschmitt | 101/123 |
| 5,031,528 | 7/1991 | Messerschmitt | 101/123 |
| 5,078,061 | 1/1992 | Messerschmitt | 101/123 |
| 5,099,758 | 3/1992 | Hassler et al. | 101/120 |
| 5,287,806 | 2/1994 | Nanzai | 101/123 |
| 5,345,862 | 9/1994 | Giard | 101/123 |
| 5,452,655 | 9/1995 | Tani | 101/123 |
| 5,476,039 | 12/1995 | Hiruta et al. | 101/123 |
| 5,483,879 | 1/1996 | Tani et al. | 101/123 |

FOREIGN PATENT DOCUMENTS

| | | |
|---|---|---|
| 0 316 947 | 5/1989 | European Pat. Off. . |
| 0 626 259 | 11/1994 | European Pat. Off. . |
| 964 769 | 12/1956 | Germany . |
| 1-19275 | 4/1989 | Japan . |
| 6-210829 | 8/1994 | Japan . |
| 393218 | 6/1933 | United Kingdom . |
| 1135819 | 12/1968 | United Kingdom . |
| 2 202 795 | 10/1988 | United Kingdom . |
| 2 242 164 | 9/1991 | United Kingdom . |
| 2 298 393 A | 9/1996 | United Kingdom . |

Primary Examiner—Christopher A. Bennett
Attorney, Agent, or Firm—Foley & Lardner

[57] ABSTRACT

A roller squeegee apparatus for screen printing includes a resilient receptacle receiving a supply of printing material at one open side thereof. The resilient receptacle is connected at another open side thereof to a printing squeegee. One or more driven rollers are provided for squeezing the elastic receptacle for providing consistent and stable printing operations. Such arrangement of the roller squeegee apparatus provides relatively high printing precision even over long periods of continuous use.

19 Claims, 9 Drawing Sheets

PRINTING SQUEEGEE APPARATUS

This invention relates to printing squeegee apparatus. In particular to a squeegee apparatus for screen printing, which includes an elastic or flexible receptacle for storing a printing material which is pressed by a roller to squeeze the material out onto a screen.

BACKGROUND OF THE RELATED ART

It is well known to use screen printing for forming electronic circuit patterns on an insulating substrate. It is also known that screen printing needs a screen which is laid on an insulating board for printing. Also known are a squeegee apparatus which functions as a spatula for traveling above the screen to apply a specified amount of printing material thereto. The material is then squeezed through the screen onto the substrate.

The squeegee apparatus prints a layer of printing material on the insulating substrate according to a specified electronic circuit pattern. The pattern is formed by the printing holes formed through the screen. The drilled substrate is separated from the screen, and heated to dry and set the circuit pattern. A screen utilized for such process may be made of stainless steel mesh, for example.

The squeegee apparatus stores printing material in a substantially triangular space defined between two plates, which are nearly equal in width to the screen. The material can drop or fall naturally toward the screen through a slit formed at the bottoms of the plates, positioned at the apex of a substantially right angle.

Such a conventional squeegee apparatus allows printing material to drop naturally (i.e. by gravity) through the slit. However, as printing material of high viscosity is utilized, it is difficult to assure an even supply of printing material along the overall width of the slit. Thus, uneven printing may result and general printing precision is reduced.

Therefore, it becomes necessary to always monitor the state of the printing material supply and long term continuous operation cannot be reliably assured.

Thus, it has been required to provide a roller squeegee apparatus for screen printing which can operate continuously for a long time. Also, a roller squeegee apparatus which is effective to equalize and improve printing precision, and stabilize printing operations, is highly desirable.

SUMMARY OF THE INVENTION

Thus, it is an object of the present invention to overcome the drawbacks of the related art.

It is a further object of the invention to provide a roller squeegee apparatus which can function smoothly, even for long periods of continuous operation.

The present invention also seeks to provide a roller squeegee apparatus which is effective to equalize and improve printing precision, as well as providing stable printing operation.

According to one aspect of the invention, there is provided a roller squeegee apparatus for screen printing, comprising: first means for supplying a printing material; an elastic receptacle formed of a resilient material for receiving the printing material supplied by the first means and, having an opening to which a printing squeegee is fitted; and second means for kneading the printing material in the receptacle by rolling or pressing the receptacle, so as to squeeze the material out of the squeegee.

Specifically, the apparatus is characterized by an elastic or flexible tubular receptacle having one open end connected to a printing material supply port, and another open end which is connected to a printing squeegee. Further, one or more rollers are provided which may be driven for squeezing the receptacle, whereby the printing material is forcibly fed to, and extruded from, the squeegee. According to this structure, uneven printing is avoided regardless of a viscosity of the printing material, such that highly precise printing is possible.

DESCRIPTION OF THE PREFERRED EMBODIMENT

Hereinbelow, a preferred embodiment of the invention will be explained in detail with reference to the drawings.

Figure 1:
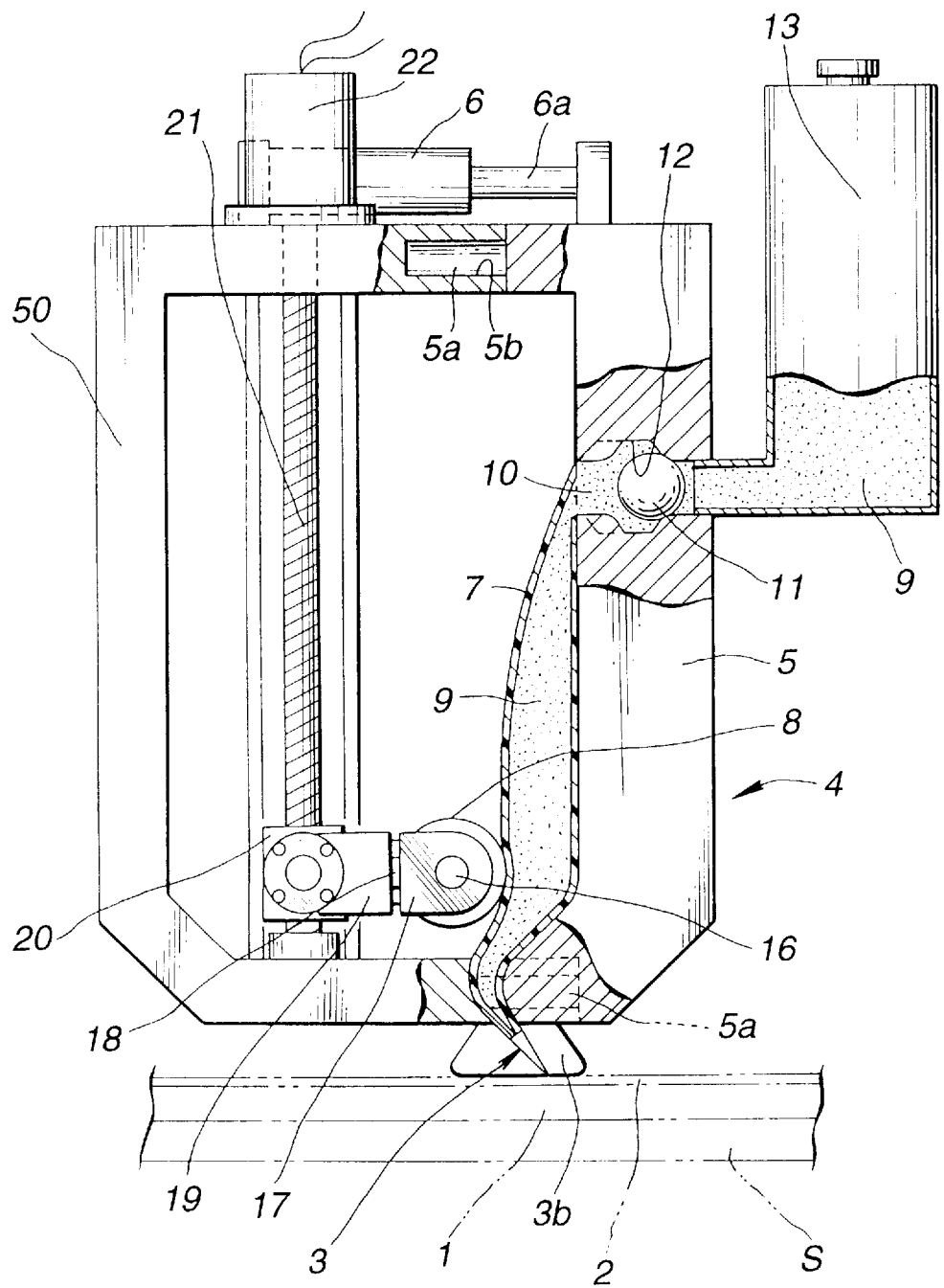
FIG. 1 is a front view partially in cross section showing an embodiment of the present invention.
Figure 2:
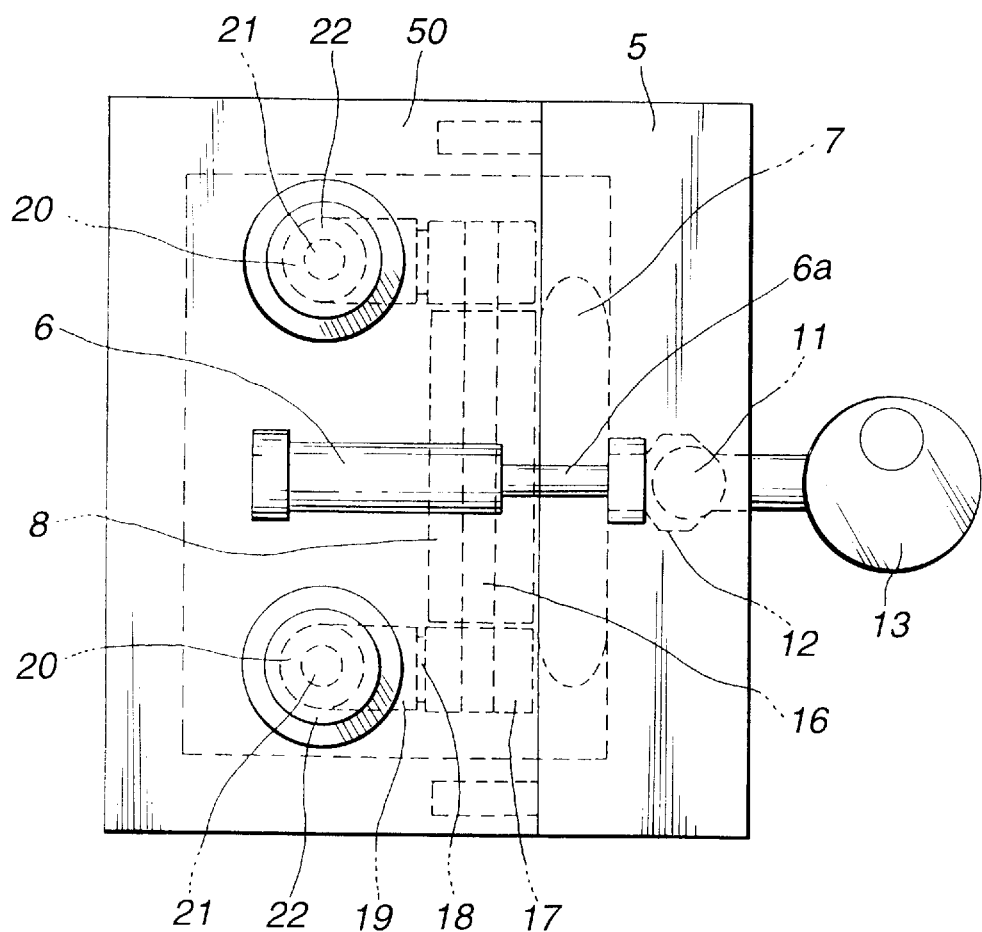
FIG. 2 is a plan view of the embodiment shown in FIG. 1.

The preferred embodiments of the present invention are explained below with reference to the drawings. As shown in FIGS. 1 and 2, a screen 2 is laid on an insulating substrate 1, which is set on a screen process printer. The printer (not shown) supports, above the screen, a roller squeegee apparatus 4 including a printing material squeegee 3.

The roller squeegee apparatus 4 includes a pair of frames 5 and 50, which are each square or rectangular, but with one open side in cross section. The open sides of the frames 5 and 50 face each other. The frames 5 and 50 have guide pins 5a and guide holes 5b on their open sides. The frames 5 and 50 are separably joined by hydraulic cylinders and pistons 6a, which operate as clamps, so as to form a casing open on both sides. The casing contains a flexible receptacle 7 and a roller 8 for rolling the receptacle 7. Although not shown in the drawings, the hydraulic cylinders 6 are properly provided, not only on the top of the casing, as illustrated, but also on both sides and the bottom of the casing.

The hydraulic cylinders 6 and pistons 6a may be replaced by servo motors and rods reciprocally connected with the motors. The receptacle 7 takes the form of a tube or a bag having a closed end. The receptacle 7 is made of synthetic resin such as nylon or an elastic or flexible material such as rubber, so as not to be easily broken or damaged when it contains a printing material 9, such as ink or soldering paste, and is rolled. If the receptacle 7 is tubular, one end is connected to the printing material supply port 10 formed in the frame 5.

The other end is joined by a proper adhesive or the like to the printing material squeegee 3, which protrudes between the frames 5 and 50 toward the screen 2. Alternatively, the other end may be joined separably in the form of a cassette utilizing a fastener, which can engage with a rough surface.

If the receptacle 7 is bag-like, or flexible, it takes the form of a cassette containing a specified amount of printing material 9. The closed end of the bag is properly fixed at the supply port 10, and the other end is connected to the squeegee 3.

The printing material supply port 10 is connected to a printing material tank 13 through a valve chest 12, which has a ball 11 or another check valve.

The receptacle 7 may have an opening, not shown, in parallel with the port 10, the frame 5 may have a structure, not shown, which is similar to the valve chest 12 having the check valve. This valve chest 12 may be connected to the opening in the receptacle 7 to release or discharge air bubbles, which may be contained in some types of printing material. The receptacle 7 is supplied with the material 9 stored in the tank 13. The tank 13 is supported properly by the frame 5 and belongs to it.

Alternatively, printing material may be supplied through a flexible pipe from a printing material tank, which is properly supported on the screen printer or the like.

Figure 3:
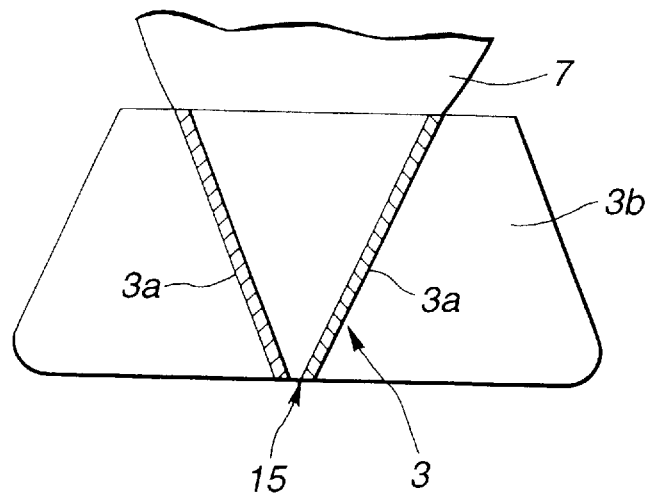
FIG. 3 is a front view in cross section of the printing material squeegee.

If there is a need to control the temperature of the material, the casing is closed and a temperature control means (not shown) is provided therein, while another temperature control means (not shown), such as a diode and heater may be provided in the tank 13 as well. As shown in FIG. 3, the printing material squeegee 3 is nearly triangular with two thin plates 3a, which are specified in length and width, and which may be formed of resin, carbon or metal.

The right and left sides of the squeegee are locked in contact with side plates 3b, while the bottom side is open, and a slit 15 is formed at the opposite apex. The squeegee 3 holds the printing material 9, which can be extruded through the slit 15. The plates 3a are joined or connected properly at least at their tops to the frames 5 and 50. It is therefore possible to control the width of slit 15 by the hydraulic cylinders 6 adjusting the distance between the frames 5 and 50.

It is also possible to fix or keep the condition or state of the printing material. The side plates 3b are fixed to and suspended from one of the frames 5 and 50. The bottoms of the side plates 3b are finished like a mirror surface for slidable contact with the screen 2 in consideration of oscillation or fluctuation of the printing material squeegee 3.

Each side plate 3b is rectangular or nearly trapezoidal and has a specified width between the front and rear sides of the squeegee 3. The side plates 3b are positioned on the right and left sides of the squeegee 3. The side plates 3b contact with the screen so that the casing weight is applied on the screen because the casing weight is not applied to the squeegee 3. The side plates 3b function to press the screen 2 on the substrate 1, so that the printing precision is improved. Therefore, a support table or frame (S in FIG. 1) is specially provided to bear the casing weight applied on the side plates 3b.

The roller 8 is made of rubber, synthetic resin or other elastic material. The roller 8 has a shaft 16, which extends on its axis and protrudes at both ends. The ends of the shaft 16 are supported rotatably on a pair of brackets 17. Each bracket 17 is coupled to one end of a telescopic arm 18, the other end of which engages horizontally with a telescopic drive 19. Alternatively, the roller 8 may not be soft, but may be made of metal or other hard material.

The telescopic drive 19 is either a hydraulic cylinder or a servo motor. The drive 19 is coupled with a collar 20 having a thread in its inner peripheral surface. The collar 20 engages with a screw shaft 21 which is supported rotatably on its vertical axis by the frame 50. The top of the shaft 21 protrudes from the top of the frame 5, and is connected to an electric motor 22 through a proper speed reducing mechanism. A pair of motors 22 are adapted to respectively rotate a pair of the shafts 21 synchronously with each other. The rotations of the shafts 21 at the same time can move the drives 19 vertically at the same time and same pitch through the collars 20. While the drives 19 are moving vertically, the telescopic arms 18 can his moved toward or away from the receptacle 7.

When printing is made with the printing material 9 applied on the screen 2, the electric motors 22 are rotated in synchronism to lift the telescopic drives 19 through the collars 20 along the screw shafts 21. When the receptacle 7 is filled with the material 9, and printing has started, the motors 22 are rotated reversely to lower the drives 19, and the telescopic arms 18 are extended from the drives 19 toward the frame 5.

When the telescopic arms 18 have extended, the receptacle 7 is interposed between the roller 8 and the inner wall of the frame 5. The roller 8 moves downward in compressive contact with the receptacle 7. As a result, the receptacle 7 is rolled and squeezed from the top down, therefore, the inside printing material 9 is forcibly moved toward the squeegee 3, and extruded through the slit 15 toward the screen 2. The lift of the lowered roller 8 functions to suck upward the material 9 in the squeegee 3, this is effective when the roller squeegee apparatus 4 is removed after printing.

Therefore, by lowering the roller 8 at a constant speed, the amount of printing material 9 extruded from the squeegee 3 is made constant, so that, the material 9 can be equally applied on the screen 2. In screen process printing, a screen 2 laid on a substrate 1 moves in a horizontal direction (right in FIG. 1). Alternatively, the substrate 1 and screen 2 may be fixed, and the roller squeegee apparatus 4 may instead move horizontally. Some types of printing material are very likely to harden if they are not kneaded constantly. By repeating the vertical movement of the roller 8 and the reciprocation of 18 relative to the receptacle 7, not merely to extrude the material 9, it is possible to constantly or always knead the material 9 in the receptacle 7.

Figure 4:
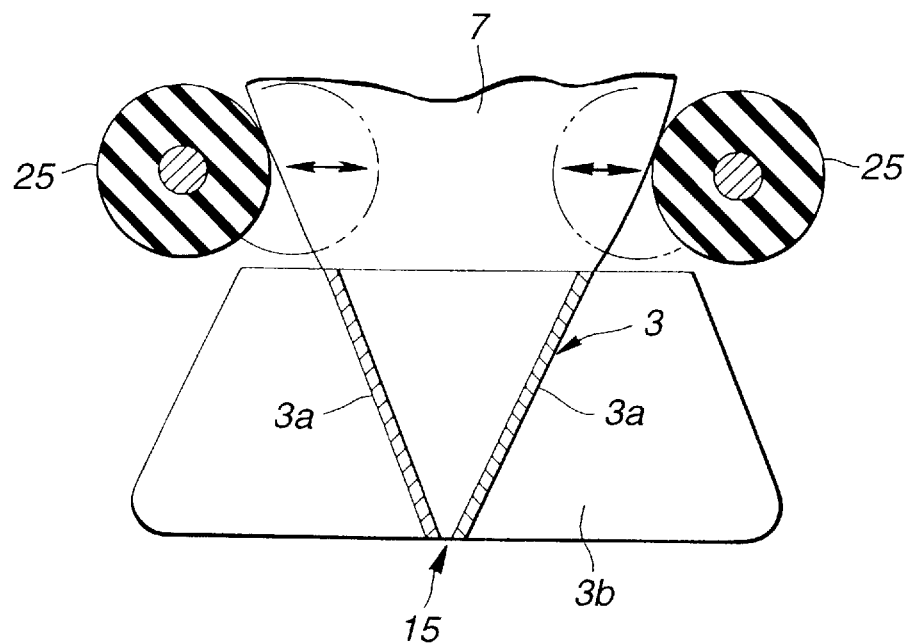
FIG. 4 a front view in cross section showing a main portion of the squeegee.

As may be appreciated in FIG. 4, if the rolling action of the roller 8 alone cannot assure that a consistent amount of printing material 9 is extruded from the slit 15, a pair of auxiliary rollers 25 may be provided to contact with and pinch the receptacle 7 above the printing material squeegee 3. One or both of the auxiliary rollers 25 may be moved horizontally with respect to the frames 5 and 50 by a hydraulic cylinder or a servo motor (not shown) so that the rollers 25 approach each other. The rollers 25 are made of elastic material such as rubber or synthetic resin. Consequently, the receptacle 7 can be squeezed immediately above the squeegee to extrude the material 9 forcibly and equally.

Figure 5:
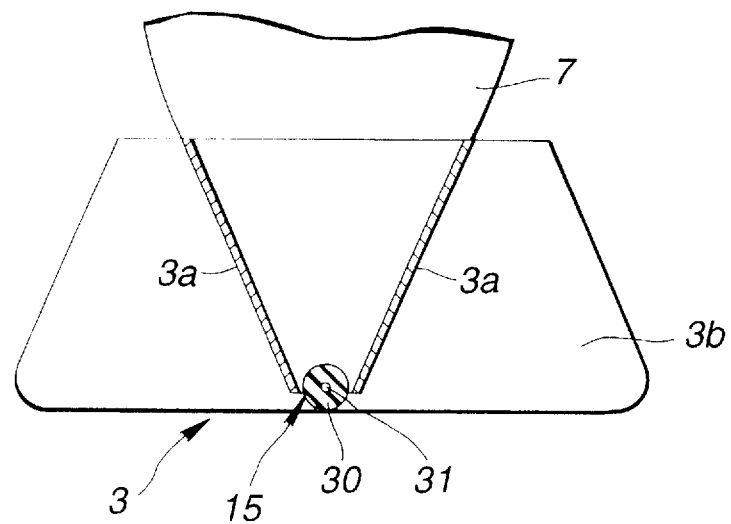
FIG. 5 is a front view in cross section showing a modified squeegee according to the invention.

The printing material squeegee 3 of this invention may be adapted for proper replacement depending on the viscosity of the printing material 9. If the viscosity of printing material 9 is low, a roller 30 may, as shown in FIG. 5 be positioned in the slit 15 of the squeegee 3 and supported rotatably by a shaft 31, which is supported on the side plates 3b. The roller 30 may be soft and made of rubber, synthetic resin or the like, or alternatively be hard and made of synthetic resin, metal or the like.

Figure 6:
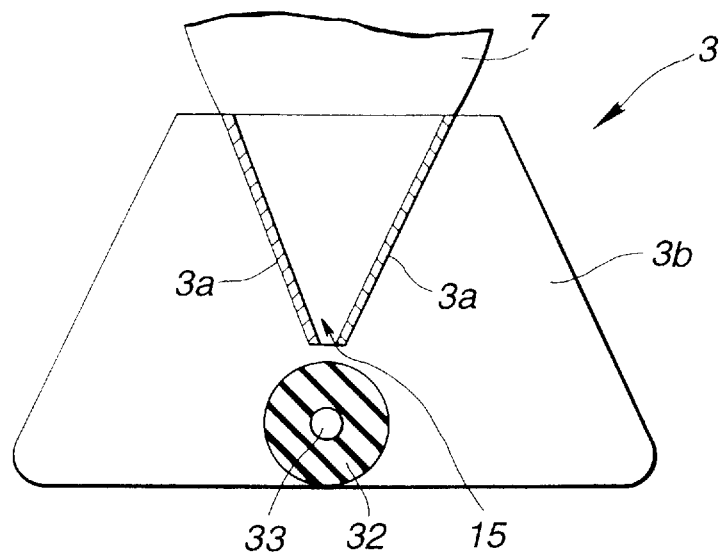
FIG. 6 is a front view in cross section showing another modified printing material squeegee.

If the viscosity of printing material 9 is high, a roller 32 may, as shown in FIG. 6 be supported rotatably at a specified distance below the slit 15 in the printing material squeegee 3. The roller 32 has a shaft 33 supported by the side plates 3b, which are widened, of the squeegee 3. The roller 32 may be soft and made of rubber, synthetic resin or the like or alternatively be hard and made of synthetic resin, metal or the like.

Figure 7:
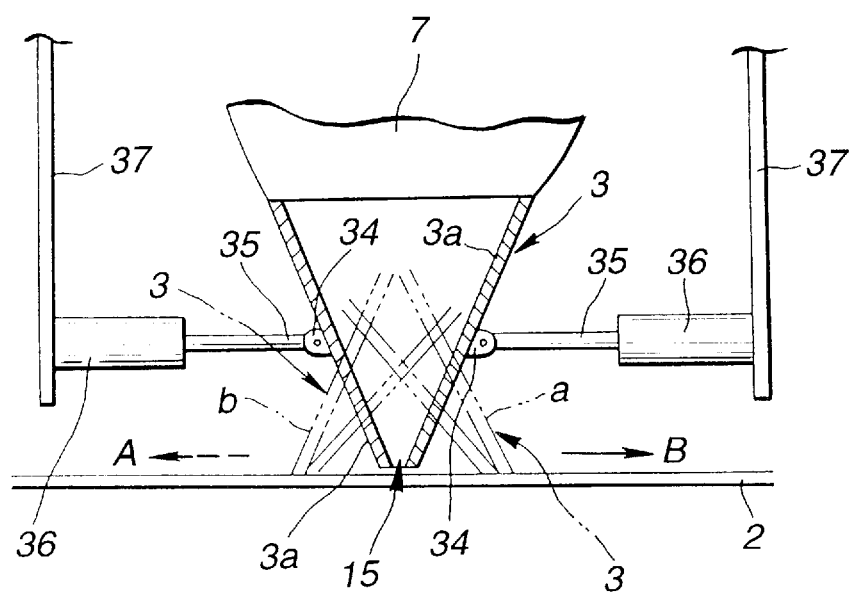
FIG. 7 is a front view in cross section showing still another modified printing squeegee.

The bottom of the printing material squeegee 3 slides on the screen 2 when either the screen or the roller squeegee apparatus 4 moves horizontally. It is therefore desirable that the squeegee 3 be inclined a little in the driving direction toward the sliding surface. For this purpose, as shown in FIG. 7, each plate 3a of the squeegee 3 may have a bracket 34 fixed to a side of it, a shaft 35 may be swingably connected to the bracket 34, and can be telescoped by a hydraulic cylinder 36 or a servo motor, which may be fixed to a support frame 37 supported by the frames 5 and 50 of the printer. This enables the squeegee 3 to incline forward and backward a specified angle with respect to the screen 2.

Specifically, when the roller squeegee apparatus 4 or the screen 2 moves in the direction A, the printing material squeegee 3 is inclined as shown by the two dot chain lines a. When the apparatus 4 or the screen 2 moves in the direction 13, the squeegee 3 is inclined as shown by the two dot chain lines.

Figure 8:
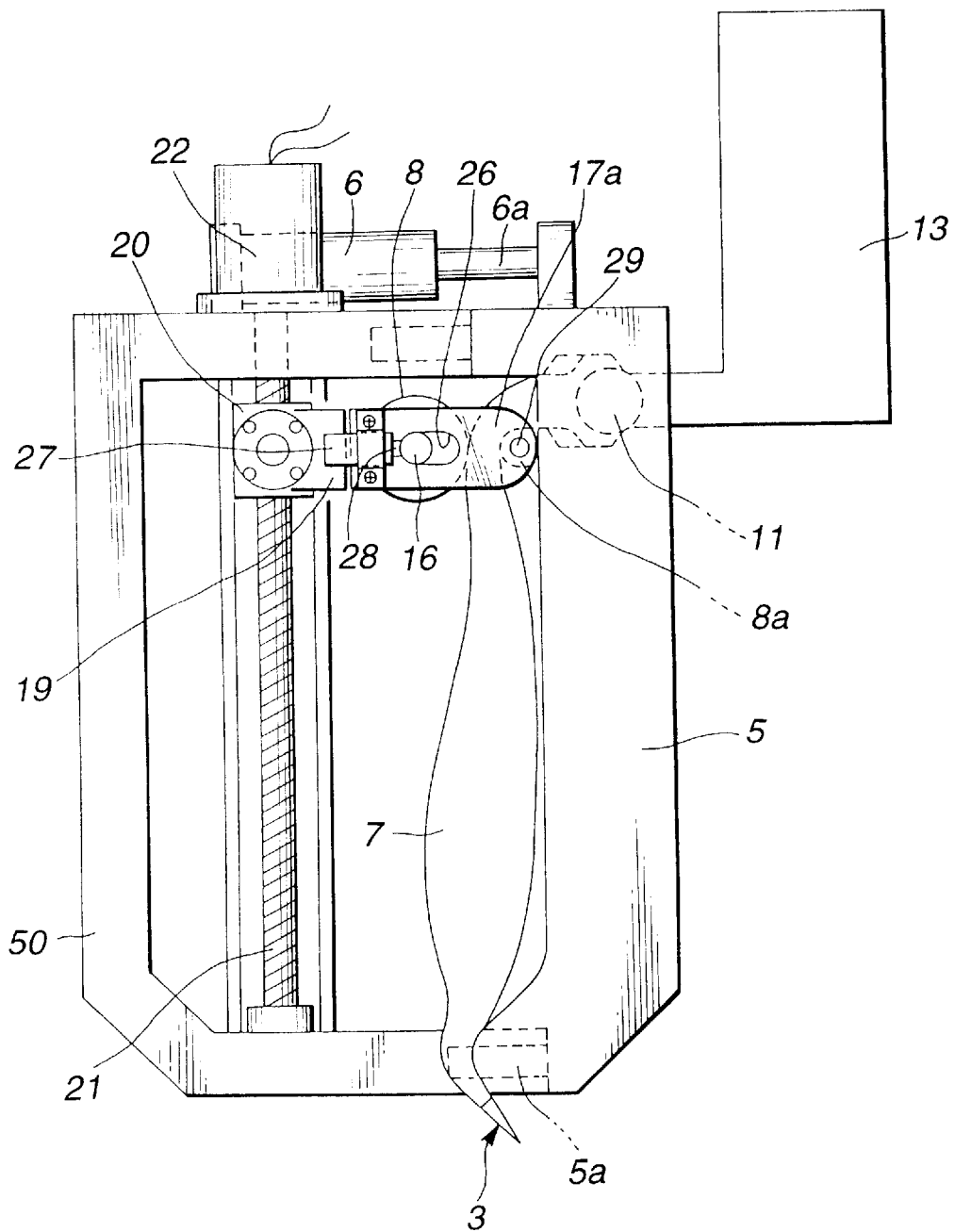
FIG. 8 is a front view partially in cross section showing the second embodiment of the invention.

The second embodiment of the invention is described below. In the previous embodiment, the receptacle 7 can be squeezed between the roller 8 and the inner wall of the frame 5. In the present embodiment, as shown in FIG. 8, the receptacle 7 can be squeezed by two rollers 8 and 8a. Specifically, the bracket 17a of a telescopic arm 18 is a little longer than in the previous embodiment, and has a slot 27, through which the shaft 16 of a roller 8 extends. Provided are a hydraulic cylinder or a servo motor 27 for rotating the shaft 16, and an actuator 28 for telescoping from it. The receptacle 7 can be pinched between the roller 8 and the roller 8a, which is supported rotatably on a shaft 9. Otherwise, the structure is similar to that of the previous embodiment, therefore redundant explanation is omitted for brevity.

With the rollers 8 and 8a squeezing an upper portion of the receptacle 7, the electric motors 22 are actuated to rotate the screw shafts 21 in synchronism, which lower the collar 20. At the same time, the servo motors 27 are rotated to move the shaft 16 toward the shaft 29. As a result the rollers 8 and 8a move downward while rolling the receptacle 7 to extrude the printing material 9 toward the squeegee 3.

Figure 9:
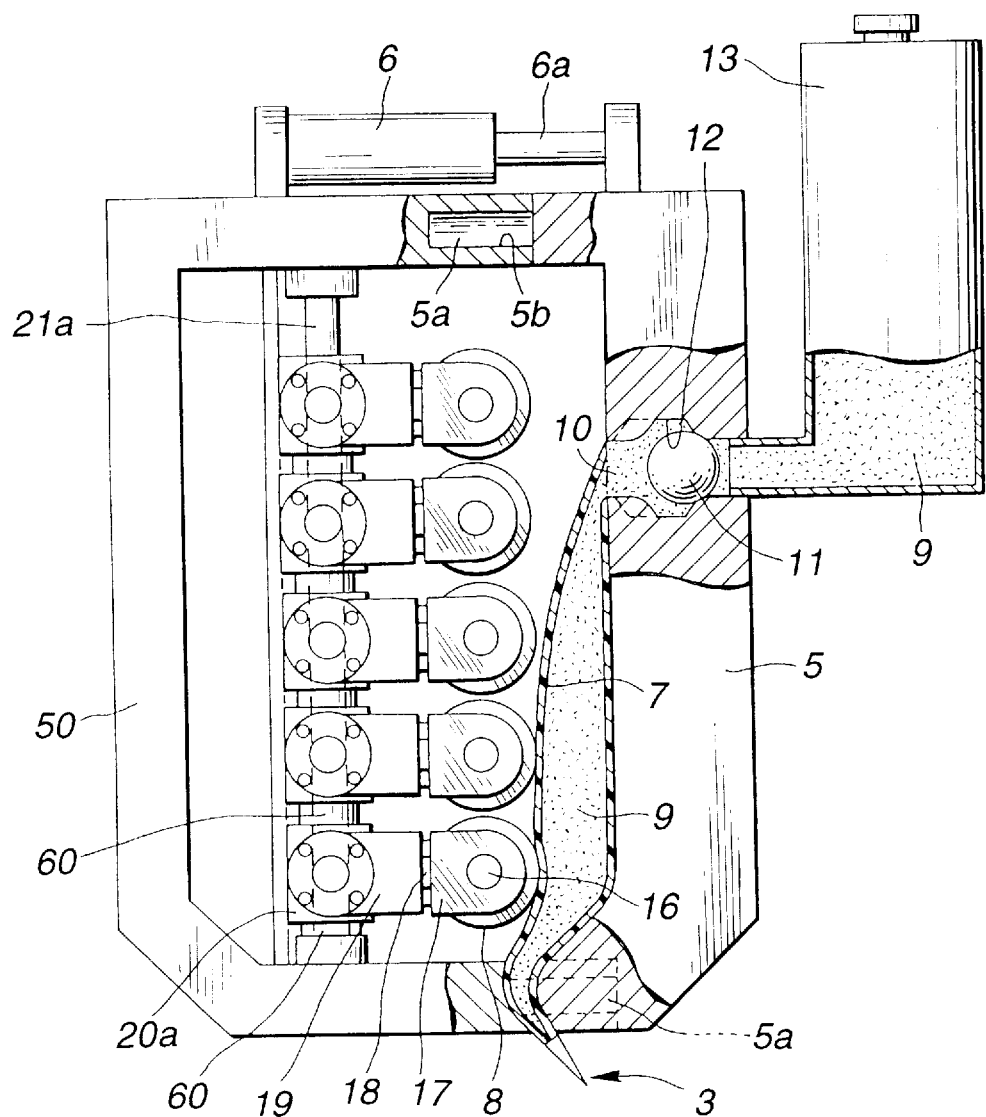
FIG. 9 is a front view partially in cross section showing the third embodiment of the invention.

The third embodiment of the invention will now be described hereinbelow. As with the second embodiment, redundant description similar to that of the first embodiment will be omitted. As shown in FIG. 9, in place of the screw shafts 21, a rod 21a supports a number of sleeves 20a above one other with spacers 60 interposed. The sleeves 20a support rollers 8 through telescopic drives 19, telescopic arm brackets 17 and shafts 16, respectively. The rollers 8 can rotate and move toward and away from the receptacle otherwise, the structure is the same as in the first embodiment. Accordingly, by protruding the rollers 8 in descending order downward along the receptacle 7, it is possible to squeeze the printing material 9 in the receptacle 7 downward and toward the squeegee 3.

Figure 10:
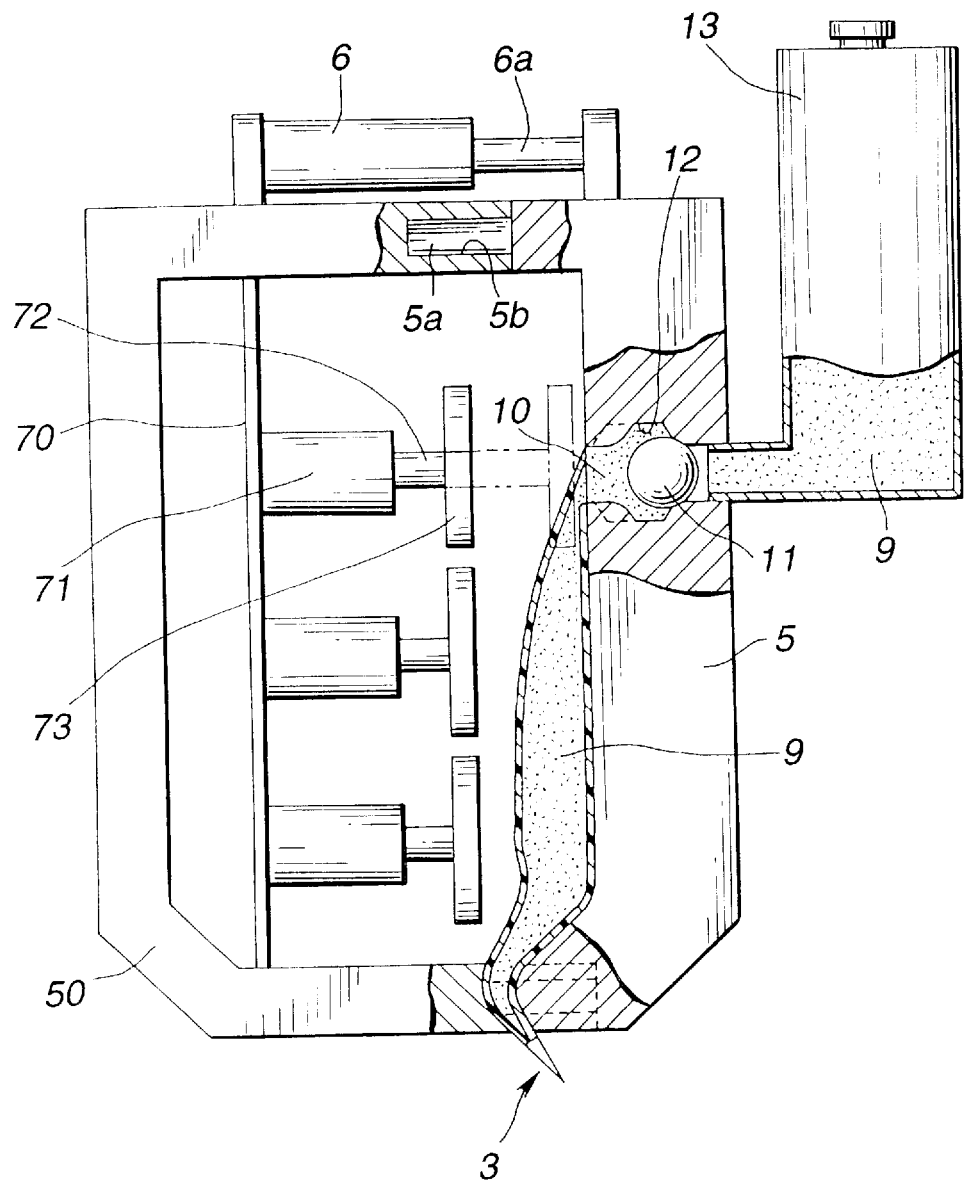
FIG. 10 is a cross section showing a fourth preferred embodiment according to the invention.

The third embodiment shown in FIG. 9 may be modified extensively in the fourth embodiment shown in FIG. 10. As shown in FIG. 10, a support 70 in place of the screw shafts 21 supports cylinders 71. Each cylinder 71 engages with a piston rod 72, which can reciprocate relative to the receptacle 7, and to which a press plate 73 is fixed. Otherwise, the structure is the same as in the first embodiment, and therefore the repeated explanation is omitted. In this embodiment, by protruding the press plates 73 in descending order downward along the receptacle 7, it is possible to squeeze the printing material 9 in the receptacle 7 downward and toward the squeegee 3. By repeating this operation, the material 9 can be kneaded.

Figure 11:
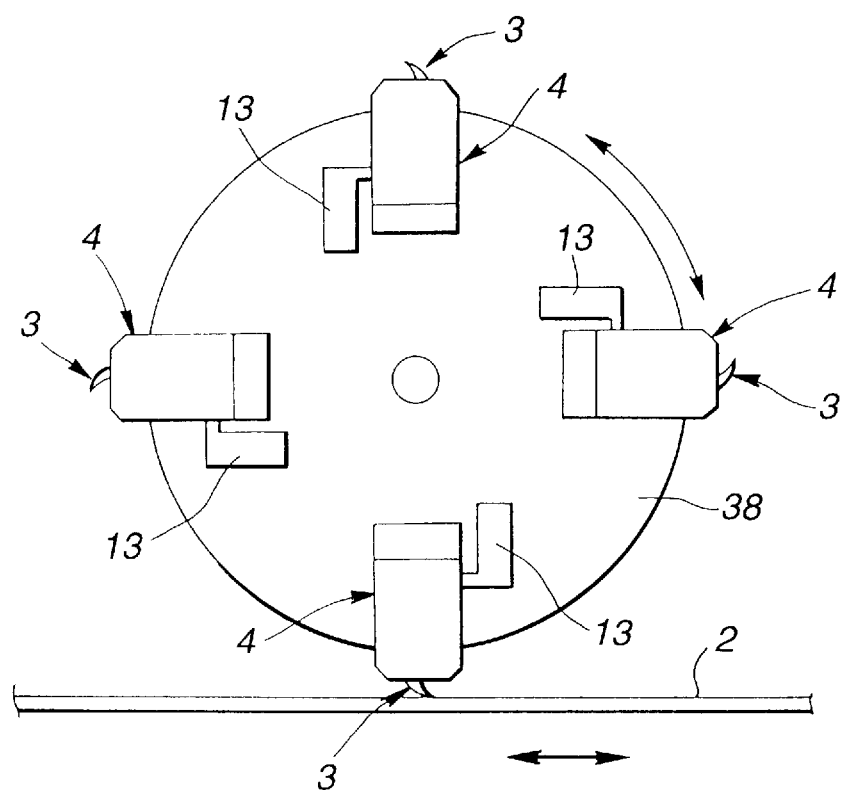
FIG. 11 is a front view of squeegee apparatus for screen printing, showing an example utilizing a printing squeegee according to the invention.

For multicolor printing, as shown in FIG. 11, a turret board 38 such as a rotatable disc may be supported above the screen 2. The board 38 may carry roller squeegee apparatuses 4 fixed to its periphery at specified intervals in such a manner that the positions of the apparatuses 4 can be adjusted. The respective printing material squeegees 3 may slidably contact with the screen 2. The printing material tanks 12 and receptacles 7 of the apparatuses 4 may contain printing materials 9 of different colors, respectively, when one of the colors is needed, the board 38 can be rotated until the associated apparatus 4 faces the screen 2. Then, the receptacle 7 of this particular apparatus 4 can he squeezed similarly to the above method to apply the material 9 from the squeegee 3.

The roller squeegee apparatuses may not be limited to screen printing. Instead, such a thin film formation may he made that paste is stored in a receptacle 7 and squeezed out to coat a post card or another paper with a thin film of paste from a printing material squeegee 3.

By rolling with the rollers the receptacle containing printing material, the invention makes it possible to effectively supply printing material in a printing method which kneads highly viscous printing material. It is also possible to make constant and equal the amount of printing material extruded from the squeegee onto a screen. Therefore, the printing precision can be improved. In addition, it is possible to not only squeeze printing material out by means of the rollers, but also always knead thixotropic material in the receptacle by repeating the rolling up and down. As a result, the material can be equally dispersed, so that continuous printing operation for long time periods is possible, and the operation can be stably assured.

The present invention in not limited only to the description as herein disclosed but may be modified and embodied in other ways without departing from the scope or inventive concept of the invention as set forth above.

What is claimed:

1. A roller squeegee apparatus for screen printing, comprising:

a source for supplying printing material;

a receptacle formed of a resilient material for receiving printing material supplied by said source;

a printing squeegee for receiving printing material from said receptacle; and at least one roller for kneading printing material in said receptacle by rolling said receptacle, so as to squeeze material out of said squeegee.

2. A roller squeegee apparatus as set forth in claim 1, further comprising:

a printing material supply port at an outlet of said source;

said receptacle being tubular in configuration and having first and second open ends, said first open end is connected to said printing material supply port, and said second open end is connected to said printing squeegee.

3. A roller squeegee apparatus as set forth in claim 2, further comprising:

a casing for supporting said receptacle;

a hydraulic cylinder or a servo motor for driving each of said at least one roller toward and away from said receptacle, said cylinder or servo motor being supported by said casing;

at least one screw shaft for moving said at least one roller along said receptacle; and at least one motor for rotating said at least one screw shaft.

4. A roller squeegee apparatus as set forth in claim 3, wherein said receptacle is squeezed between said at least one roller and said casing.

5. A roller squeegee apparatus as set forth in claim 3, wherein said at least one roller moves horizontally toward and away from said receptacle by being driven by said hydraulic cylinder or servo motor, cylinder or servo motor being so supported by a casing that it and said at least one roller moves vertically along said receptacle by being driven by said at least one screw shaft being rotated by said motor.

6. A roller squeegee apparatus as set forth in claim 3, further comprising:

at least one actuator for controlling opening and closing of said printing squeegee, said at least one actuator being supported by said casing.

7. A roller squeegee apparatus as set forth in claim 3, further comprising:

at least one actuator for orienting said printing squeegee at a specified angle with respect to relative movement of said printing squeegee during printing, said at least one actuator being supported by said casing.

8. A roller squeegee apparatus as set forth in claim 2, wherein said at least one roller includes a pair of rollers for pinching said receptacle between said pair of rollers, said pair of rollers being movable toward and away with respect to one another.

9. A roller squeegee apparatus as set forth in claim 2, wherein said at least one roller comprises a plurality of rollers arranged along said receptacle, each of said plurality of rollers being independently movable for sequentially squeezing said receptacle in a multistage process beginning nearer to said first end and finishing nearer to said second end.

10. A roller squeegee apparatus as set forth in claim 9, wherein each of said plurality of rollers moves horizontally toward and away from said receptacle by being driven by a hydraulic cylinder or a servo motor, and each of said plurality of rollers moves vertically along said receptacle by being driven by at least one screw shaft being rotated by at least one motor.

11. A roller squeegee apparatus as set forth in claim 2, wherein said at least one roller comprises a pair of rollers for pinching said receptacle proximate to said second end.

12. A roller squeegee apparatus as set forth in claim 2, wherein said source includes a check valve connected between said printing material supply port and a tank for storing printing material, said tank being supported by a casing supporting said at least one roller.

13. A roller squeegee apparatus as set forth in claim 12, further comprising:

a hydraulic cylinder or a servo motor for driving each of said at least one roller toward and away from said receptacle, said cylinder or servo motor being supported by said casing;

at least one screw shaft for moving said at least one roller along said receptacle; and at least one motor for rotating said at least one screw shaft.

14. A roller squeegee apparatus as set forth in claim 12, further comprising:

at least one actuator for controlling opening and closing of said printing squeegee, said at least one actuator being supported by said casing.

15. A roller squeegee apparatus as set forth in claim 12, further comprising:

at least one actuator for orienting said printing squeegee at a specified angle with respect to relative movement of said printing squeegee during printing, said at least one actuator being supported by said casing.

16. A roller squeegee apparatus as set forth in claim 2, wherein said printing squeegee includes a printing material extrusion slit, a roller is supported rotatably in and along said slit for adjusting an extrusion amount of low viscosity printing material.

17. A roller squeegee apparatus as set forth in claim 2, wherein said printing squeegee includes a printing material extrusion slit, a roller is supported rotatably in parallel with and spaced apart from said slit for adjusting an extrusion amount of high viscosity printing material.

18. A roller squeegee apparatus as set forth in claim 3, wherein said casing includes a pair of frames, each of said pair of frames is rectangular in cross section and has an open side, said pair of frames are separably joined open side to open side and spacing between said pair of frames is adjustable.

19. A squeegee apparatus for screen printing, comprising:

a source for supplying printing material;

a receptacle formed of a resilient material for receiving printing material supplied by said source;

a printing squeegee for receiving printing material from said receptacle; and a press for kneading printing material in said receptacle by pressing said receptacle, so as to squeeze material out of said squeegee.

\* \* \* \* \*